United States Patent
Cho et al.

(10) Patent No.: US 12,300,874 B2
(45) Date of Patent: May 13, 2025

(54) ANTENNA PACKAGE WITH VIA STRUCTURE AND METHOD OF FORMATION THEREOF

(71) Applicant: Infineon Technologies AG, Neubiberg (DE)

(72) Inventors: Eung San Cho, Torrance, CA (US); Ashutosh Baheti, Munich (DE); Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/485,735

(22) Filed: Oct. 12, 2023

(65) Prior Publication Data
US 2024/0047855 A1   Feb. 8, 2024

Related U.S. Application Data

(62) Division of application No. 16/997,415, filed on Aug. 19, 2020, now Pat. No. 11,817,617.

(51) Int. Cl.
| | | |
|---|---|---|
| H01L 21/48 | (2006.01) | |
| H01L 23/00 | (2006.01) | |
| H01L 23/498 | (2006.01) | |
| H01L 23/66 | (2006.01) | |
| H01Q 1/22 | (2006.01) | |

(52) U.S. Cl.
CPC ..... *H01Q 1/2283* (2013.01); *H01L 23/49827* (2013.01); *H01L 23/66* (2013.01); *H01L 24/16* (2013.01); *H01L 2223/6677* (2013.01); *H01L 2224/16225* (2013.01)

(58) Field of Classification Search
CPC .............................. H01L 24/80; H01L 21/48
See application file for complete search history.

(56) References Cited

U.S. PATENT DOCUMENTS

| | | |
|---|---|---|
| 10,505,255 B2 | 12/2019 | Baheti et al. |
| 2006/0049986 A1 | 3/2006 | Dunn et al. |
| 2013/0207869 A1 | 8/2013 | Han et al. |
| 2014/0320376 A1* | 10/2014 | Ozdemir ............. H01Q 9/0442 343/876 |
| 2016/0336646 A1 | 11/2016 | Baek et al. |
| 2017/0358528 A1* | 12/2017 | Darmawikarta .... H01L 23/5226 |
| 2019/0288377 A1 | 9/2019 | Mng et al. |

(Continued)

FOREIGN PATENT DOCUMENTS

WO   2020082361 A1   4/2020

OTHER PUBLICATIONS

Definition of "extend", https://dictionary.cambridge.org/us/dictionary/english/, 2022, in parent application.

(Continued)

*Primary Examiner* — Michele Fan
(74) *Attorney, Agent, or Firm* — Slater Matsil, LLP

(57) ABSTRACT

A semiconductor device comprises a semiconductor chip comprising a radio frequency (RF) circuit, a feedline structure coupled to the RF circuit, and an antenna structure comprising a main body stretching along a direction orthogonal to at least one side of a front side and a backside of the semiconductor device, wherein the antenna structure is coupled to the RF circuit through the feedline structure.

20 Claims, 23 Drawing Sheets

(56) References Cited

U.S. PATENT DOCUMENTS

2020/0035607 A1     1/2020   Lee et al.
2020/0412017 A1    12/2020   Park et al.
2021/0075114 A1*   3/2021   Kim .................... H01Q 9/0464

OTHER PUBLICATIONS

Park, Junho et al., "Hybrid Antenna Module Concept for 28 GHz 5G Beamsteering Cellular Devices", 2018 IEEE MTT-S International Microwave Workshop Series on 5G Hardware and System Technologies (IMWS-5G), Aug. 30-31, 2018, 3 pages.

* cited by examiner

ANTENNA PACKAGE WITH VIA STRUCTURE AND METHOD OF FORMATION THEREOF

This application is a divisional of U.S. patent application Ser. No. 16/997,415, filed on Aug. 19, 2020, which application is hereby incorporated herein by reference.

TECHNICAL FIELD

The present invention relates generally to radio frequency semiconductor devices, and in particular embodiments, to antenna-in-package (AiP) semiconductor devices.

BACKGROUND

Since the invention of the integrated circuit, the semiconductor industry has experienced rapid growth due to continuous improvements in the integration density of various electronic components. The improvement in integration density has come from continuous reductions in minimum feature size. The reduced feature size allows more components to be integrated into a given semiconductor area. As the demand for further reducing the size of the electronic device has grown recently, there has grown a need for more creative packaging techniques of semiconductor dies.

As semiconductor technologies evolve, fan-out wafer-level packaging has emerged as an effective alternative to further reduce the physical size of a semiconductor chip. In a semiconductor device having a fan-out signal routing layout, the input and output pads of a semiconductor die can be redistributed to an area outside the area under the semiconductor die. As such, the input and output pads can spread signals to a larger area than the area under the semiconductor die and provide additional space for interconnects. As a result of having the fan-out signal routing layout, the number of input and output pads of the semiconductor device can be increased.

In a fan-out wafer-level package, the semiconductor die may comprise radio-frequency integrated circuits (RFICs). An example of such a semiconductor device is an antenna-in-package (AiP) device. The AiP device includes an RFIC and an antenna. The RFIC and the antenna are included in a same package. The AiP device allows integration of RF components (e.g., an antenna) with active circuits (e.g., RFIC) into a same module. The AiP device is able to reduce the footprint of a radio frequency semiconductor device.

In some high frequency applications such as RFICs in portable devices, a variety of challenges exist. For example, in the next generation portable devices, RFICs are required to fit in a restricted installation space. More particularly, the antennas of the RFICs are restricted in an XY horizontal plane. The layout of the antennas of the RFICs has become more challenging for the next generation portable devices. Thus, there is a need to improve the layout of the antennas of the RFICs so as to meet the requirements of the ever-changing portable devices.

SUMMARY

In accordance with an embodiment, a semiconductor device with a front side and a backside opposite to the front side comprises a semiconductor chip comprising a radio frequency (RF) circuit, a feedline structure coupled to the RF circuit, and an antenna structure comprising a main body stretching along a direction orthogonal to at least one side of the front side and the backside of the semiconductor device, wherein the antenna structure is coupled to the RF circuit through the feedline structure.

In accordance with another embodiment, a method comprises forming a semiconductor chip comprising a radio frequency (RF) circuit in a semiconductor package having a first side and a second side opposite to the first side, forming a feedline structure coupled to the RF circuit, and forming an antenna structure comprising a main body stretching along a direction orthogonal to the first side of the semiconductor package, wherein the antenna structure is coupled to the RF circuit through the feedline structure.

In accordance with yet another embodiment, a semiconductor package with a first side and a second side opposite to the first side comprises a semiconductor chip comprising a radio frequency (RF) circuit, a feedline disposed over the semiconductor chip, wherein the feedline is coupled to the RF circuit, and an antenna structure coupled to the feedline through a via capture pad, and wherein a main body of the antenna structure is in the semiconductor package and oriented along a direction orthogonal to the first side of the semiconductor package.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an antenna-in-package (AiP) semiconductor device. The present disclosure may also be applied, however, to a variety of radio frequency semiconductor devices. Hereinafter, various embodiments will be explained in detail with reference to the accompanying drawings.

Figure 1:
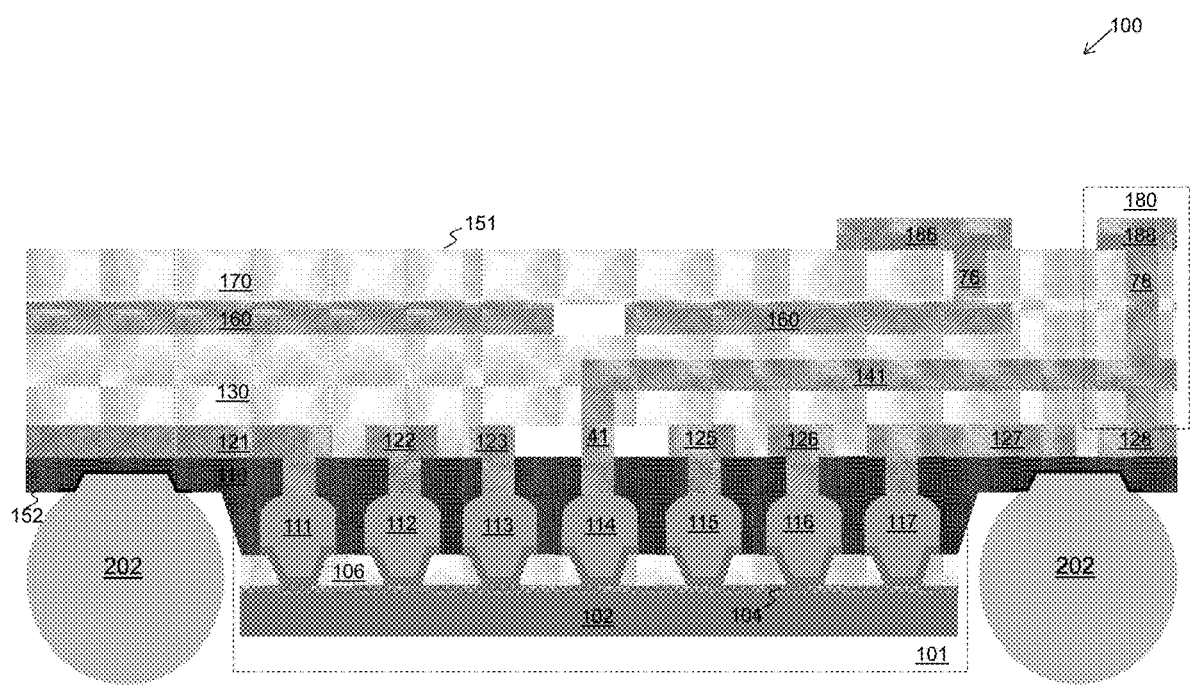
FIG. 1 illustrates a cross sectional view of an AiP device in accordance with various embodiments of the present disclosure.

FIG. 1 illustrates a cross sectional view of an AiP device in accordance with various embodiments of the present disclosure. The AiP device 100 comprises a top side 151 and a bottom side 152 as shown in FIG. 1. Throughout the description, the top side 151 and the bottom side 152 may be alternatively referred to as a backside and a front side, respectively. The AiP device 100 may be alternatively referred to as a semiconductor device or a semiconductor package.

The AiP device 100 comprises a semiconductor chip 101 mounted on the bottom side 152, and a plurality of conductive layers (e.g., 160) and laminate layers (e.g., 130 and 170) formed between the bottom side 152 and the top side 151. An optional underfill layer 110 is formed between the semiconductor chip 101 and a bottommost conductive layer (conductive layer formed by conductive elements 121-128). The AiP device 100 further comprises a plurality of input/output pads 202 mounted on the bottom side 152, and an antenna structure 180 vertically extending through the plurality of conductive layers and laminate layers.

The semiconductor chip 101 comprises a substrate portion 102 and an interconnect portion over the substrate portion. The substrate portion 102 of the semiconductor chip 101 may comprise a plurality of active circuits such as a radio frequency integrated circuit (RFIC). Throughout the description, RFIC may be alternatively referred to as a RF circuit. The interconnect portion of the semiconductor chip 101 may comprise a passivation layer 104, a buffer layer 106, a plurality of under bump metallization (UBM) structures, and a plurality of metal features such as bumps 111-117. The bumps 111-117 are electrically coupled to the bottommost conductive layer through a plurality of vias extending through the underfill layer 110.

As shown in FIG. 1, the plurality of conductive layers (e.g., 160) and the plurality of laminate layers (e.g., 130 and 170) are arranged in an alternating manner. In some embodiments, at least one conductive layer comprises a feedline structure (e.g., feedline structure 141) for coupling the antenna structure 180 to the RFIC in the semiconductor chip 101. As shown in FIG. 1, the feedline structure 141 is coupled between the RFIC of the semiconductor chip 101 and antenna structure 180.

The bottommost conductive layer comprises a plurality of conductive elements 121, 122, 123, 125, 126, 127 and 128. The bumps 111 and 117 are connected to the input/output pads 202 through conductive elements 121 and 127. Input/output pads 202 form an input/output structure for the AiP device 100. The input/output structure is configured to connecting the AiP device 100 to an external apparatus (not shown). The bumps 112 and 116 are input/output bumps for the semiconductor chip 101. As shown in FIG. 1, the bumps 112 and 116 are connected to conductive elements 122 and 126, respectively. The bumps 113 and 115 are connected to a ground plane (not shown) through the conductive elements 123 and 125, respectively. The bump 114 is connected to the feedline structure 141 through a via 41 vertically extending through the first laminate layer 130 and the underfill layer 110.

The antenna structure 180 comprises a main body 78 and an extended portion 188. The main body 78 is implemented as a via. The via is a conductive via. In some embodiments, the conductive via may be formed by drilling a hole extending from the top side 151 to a top surface of the conductive element 128, and forming a conductive surface arranged within the hole. The conductive surface may be formed by a plating process.

It should be noted that the via shown in FIG. 1 is selected purely for demonstration purposes and are not intended to limit the various embodiments of the present disclosure to any particular vias. The detailed implementations of the main body of the antenna structure 180 will be described below with respect to FIGS. 3-10.

As shown in FIG. 1, the main body 78 of the antenna structure 180 stretches along a direction orthogonal to at least one side (e.g., front side 152) of the AiP device 100. The main body 78 of the antenna structure 180 is coupled to the RF circuit through the feedline structure 141. The antenna structure 180 further extends over the backside 151 of the AiP device 100. The extended portion 188 is adjacent to an edge of the AiP device 100. A shielding layer 186 is also formed over the backside 151 of the AiP device 100.

Figure 2:
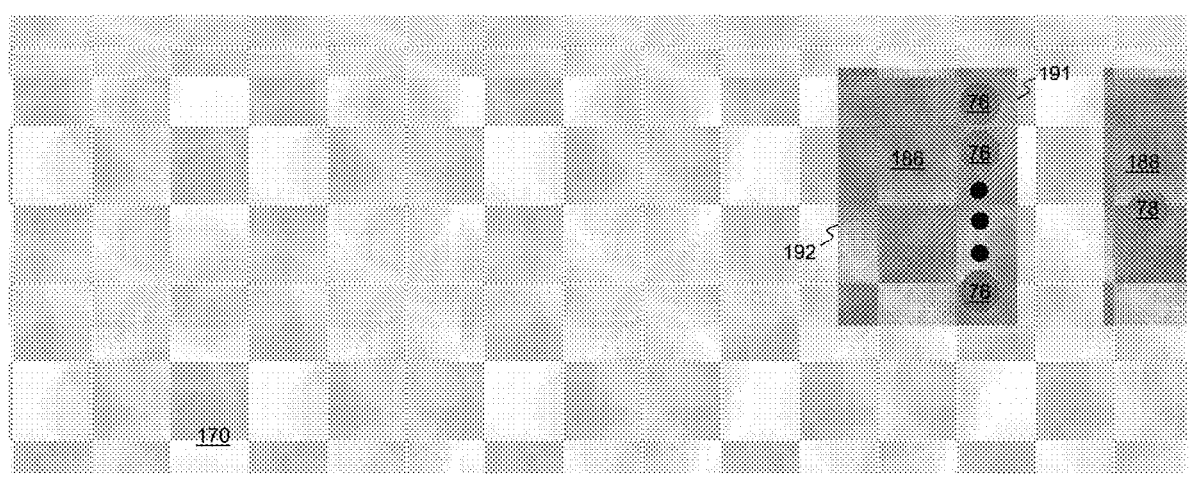
FIG. 2 illustrates a top view of the semiconductor device shown in FIG. 1 in accordance with various embodiments of the present disclosure.

FIG. 2 illustrates a top view of the semiconductor device shown in FIG. 1 in accordance with various embodiments of the present disclosure. The extended portion 188 of the antenna structure is placed adjacent to the edge of the semiconductor device. The shielding layer 186 is placed adjacent to the extended portion 188 of the antenna structure. A plurality of shielding vias 76 is connected to the shielding layer 186. As shown in FIG. 2, the extended portion 188 of the antenna structure is placed between a first side 191 of the shielding layer 186 and the edge of the semiconductor device. The plurality of shielding vias 76 and the shielding layer 186 are configured to prevent RF radiation of the antenna structure from impacting components on a second side 192 of the shielding layer 186.

As shown in FIG. 2, both the extended portion 188 of the antenna structure and the shielding layer 186 are rectangular in shape. It should be noted that the shape shown in FIG. 2 is merely an example. It is within the scope and spirit of the disclosure for the extended portion 188 of the antenna structure and the shielding layer 186 to comprise other shapes, such as, but not limited to oval, square, or circular. Furthermore, depending on different applications and design needs, the shape as well as the dimensions of the extended portion 188 of the antenna structure and the shielding layer 186 may vary accordingly. For example, the shape and/or the dimensions of the extended portion 188 of the antenna structure and the shielding layer 186 may be modified to accommodate different RF communication frequencies. It should further be noted that the arrangement of the extended portion 188 of the antenna structure and the shielding layer 186 shown in FIG. 2 is merely an example. Depending on different applications and design needs, the extended portion 188 of the antenna structure and the shielding layer 186 may be placed away from the edge of the of the semiconductor device.

Referring back to FIG. 1, the main body 78 of the antenna structure is implemented as a via. This via is connected to the feedline structure 141 through a via capture pad (e.g., via capture pad 256 shown in FIG. 3 below). The via and the via capture pad may be collectively referred to as a via structure throughout the description. FIGS. 3-9 illustrate seven different implementations of this via structure.

Figure 3:
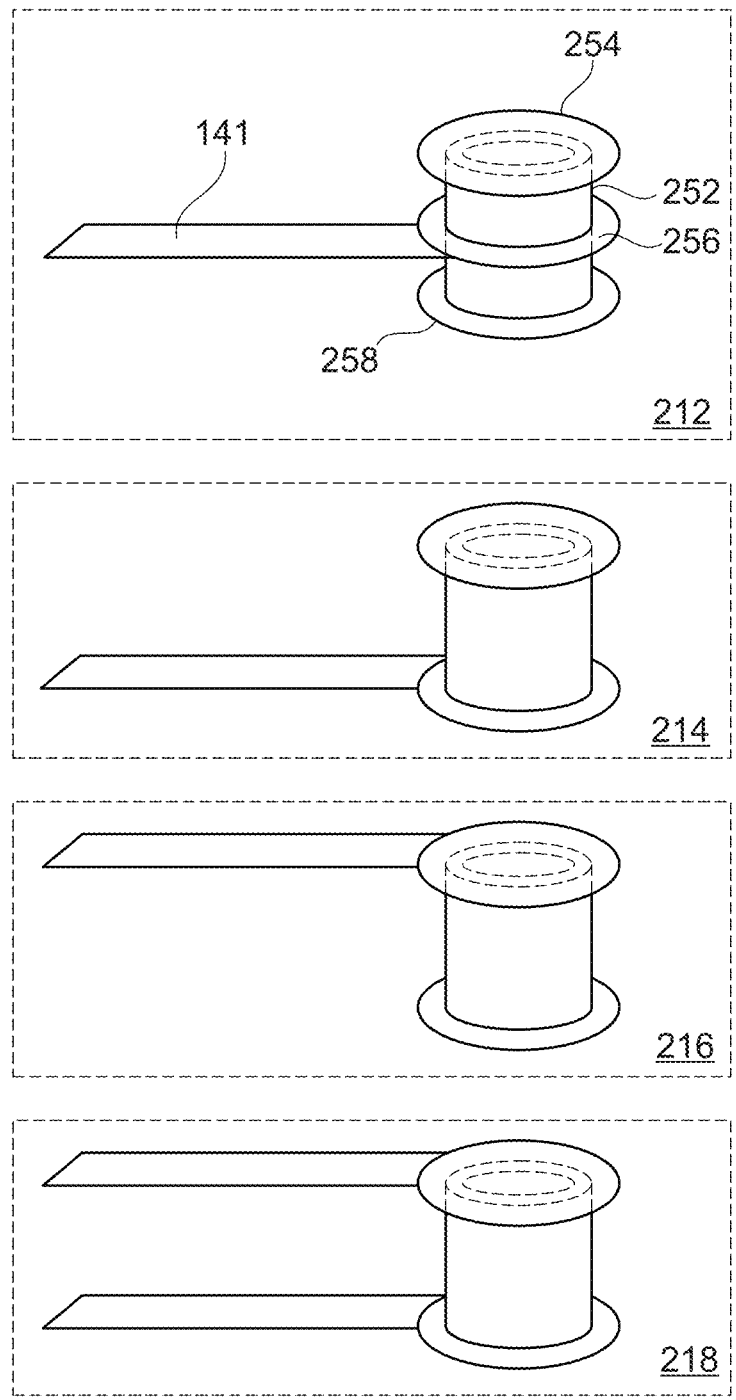
FIG. 3 illustrates a perspective view of a first implementation of the main body of the antenna structure shown in FIG. 1 in accordance with various embodiments of the present disclosure.

FIG. 3 illustrates a perspective view of a first implementation of the main body of the antenna structure shown in FIG. 1 in accordance with various embodiments of the present disclosure. The main body of the antenna structure shown in FIG. 1 can be implemented as via structures 212, 214, 216 and 218 shown in FIG. 3. The via structure 212 comprises a hole 252, an upper cap 254, a via capture pad 256 and a lower cap 258. As shown in FIG. 3, the hole 252 is surrounded by the via capture pad 256. The via capture pad 256 is connected to the feedline structure 141. The hole 252 has a conductive path connected between the lower cap 258 and the upper cap 254. In some embodiments, this conductive path is formed by plating a sidewall of the hole. In alternative embodiments, the conductive path is formed filling the hole with a conductive material. The conductive path is electrically connected to the via capture pad 256. As such, the conductive path of the hole 252 is electrically connected to the feedline structure 141.

As shown in FIG. 3, the upper cap 254 is employed to cover a first terminal of the hole. The lower cap 258 is employed to cover a second terminal of the hole. Both the upper cap 254 and the lower cap 258 are formed of a suitable conductive material such as copper. As such, both the upper cap 254 and the lower cap 258 are electrically connected to the conductive path of the hole 252. It should be noted that, depending on different design needs, the upper cap 254 may further expand to form the expanded portion 188 of the antenna structure shown in FIG. 2. In other words, the upper cap 254 and the expanded portion 188 may be formed in a single fabrication step such as a plating process. It should further be noted that, in alternative embodiments, the upper cap 254 and the expanded portion 188 may be two separate elements formed in two separate fabrication steps. For example, a first plating process is used to form the upper cap 254 to cover the hole 252. A second plating process is used to form the expanded portion 188 according to a predetermined design specification of the antenna structure.

In some embodiments, the diameter of the hole 252 is in a range from about 150 micrometers to about 250 micrometers. The diameter of the upper cap 254 and the lower cap 258 is in a range from about 250 micrometers to about 350 micrometers. In other words, the difference between the diameter of the caps and the diameter of the hole is about 100 micrometers.

It should be noted that the conductive path of the hole 252 can be implemented in a variety of different ways. In some embodiments, the hole 252 is a plated hole. In other words, the sidewall of the hole 252 is plated with a conductive material such as copper. In alternative embodiments, the hole 252 is filled with a conductive material such as copper. The conductive material may completely fill the hole 252. Depending on different design needs, the conductive material may partially fill the hole 252. Furthermore, when the hole 252 is implemented as a plated hole, a suitable dielectric material may be employed to fill the hole 252. The dielectric material may completely fill the hole 252. Alternatively, the dielectric material may partially fill the hole 252.

As shown in FIG. 3, the via structure 214 is similar to the via structure 212 except that the via structure 214 does not have a via capture pad, and the lower cap is connected to the feedline structure 141. The via structure 216 is similar to the via structure 212 except that the via structure 216 does not have a via capture pad, and the upper cap is connected to the feedline structure 141. The via structure 218 is similar to the via structure 212 except that the via structure 218 does not have a via capture pad, and the lower cap and the upper cap are connected to two feedlines of the feedline structure, respectively.

Figure 4:
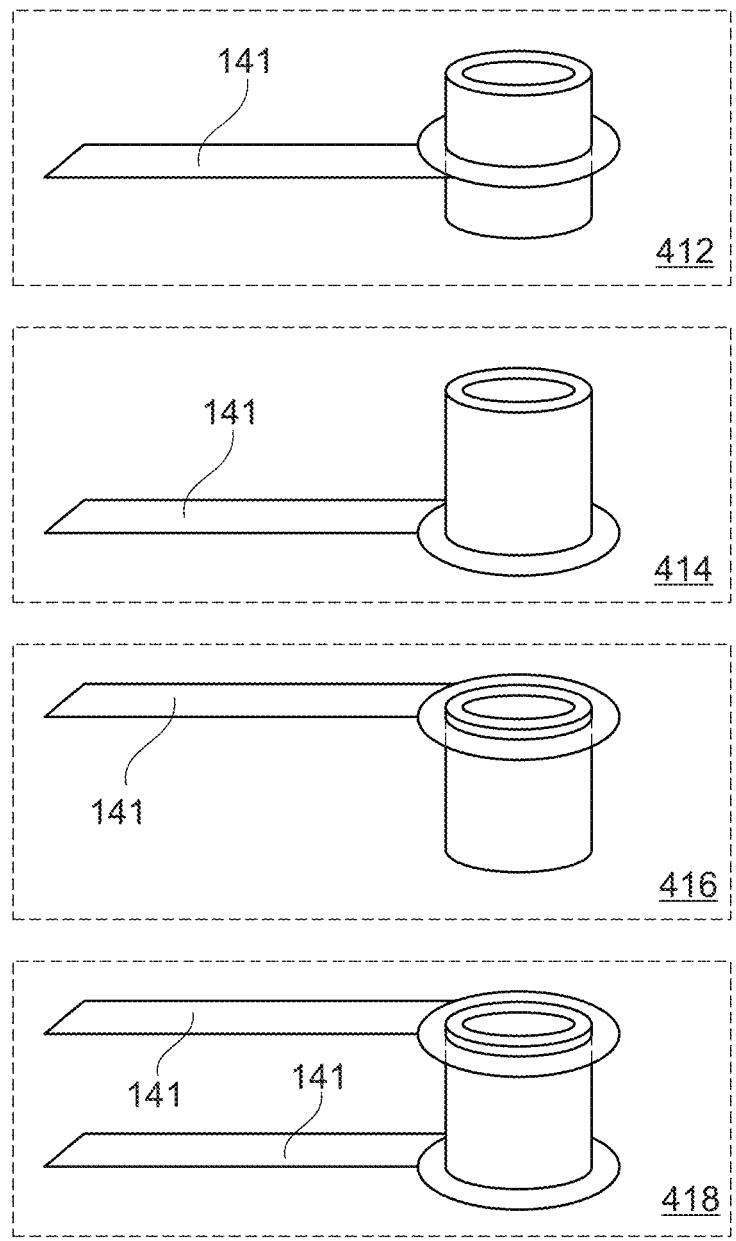
FIG. 4 illustrates a perspective view of a second implementation of the main body of the antenna structure shown in FIG. 1 in accordance with various embodiments of the present disclosure.

FIG. 4 illustrates a perspective view of a second implementation of the main body of the antenna structure shown in FIG. 1 in accordance with various embodiments of the present disclosure. The main body of the antenna structure shown in FIG. 1 can be implemented as via structures 412, 414, 416 and 418 shown in FIG. 4. The vias structures shown in FIG. 4 are similar to the respective via structures shown in FIG. 3 except that via structures 412-418 do not comprise an upper cap and a lower cap.

As shown in FIG. 4, the feedline structures coupled to the via structures 412-416 comprise a single feedline. The feedline structure coupled to the via structure 418 comprises two feedlines.

The via structure 412 is coupled to the feedline structure 141 through a via capture pad. The via capture pad is at a location between two ends of the main body of the antenna structure. The via structure 414 is coupled to the feedline structure 141 through a via capture pad. The via capture pad is located at one end (upper end) of the main body of the antenna structure.

The via structure 416 is coupled to the feedline structure 141 through a via capture pad. The via capture pad is located at the other end (lower end) of the main body of the antenna structure. The via structure 418 is coupled to two feedlines of the feedline structure 141 through two via capture pads, respectively. A first via capture pad is located at one end (upper end) of the main body of the antenna structure. A second via capture pad is located at the other end (lower end) of the main body of the antenna structure.

Figure 5:
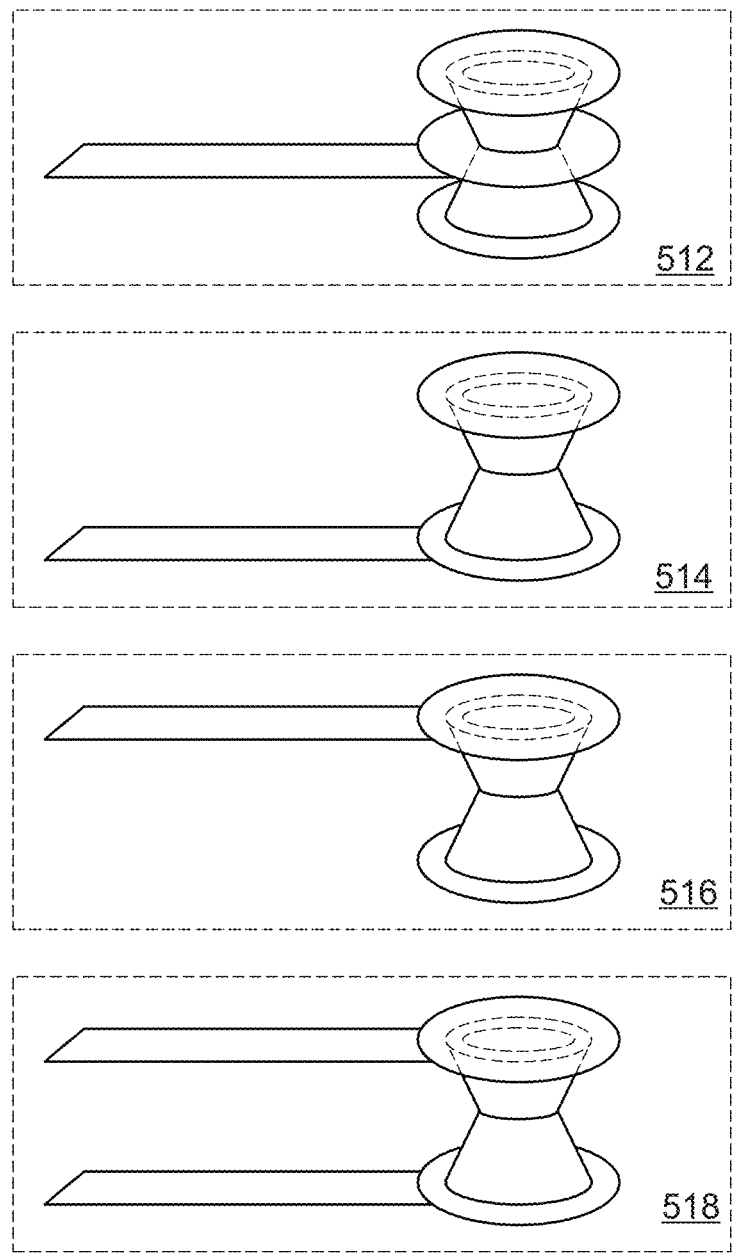
FIG. 5 illustrates a perspective view of a third implementation of the main body of the antenna structure shown in FIG. 1 in accordance with various embodiments of the present disclosure.

FIG. 5 illustrates a perspective view of a third implementation of the main body of the antenna structure shown in FIG. 1 in accordance with various embodiments of the present disclosure. The main body of the antenna structure shown in FIG. 1 can be implemented as via structures 512, 514, 516 and 518 shown in FIG. 5. The vias structures shown in FIG. 5 are similar to the respective via structures shown in FIG. 3 except that via structures 512-518 include at least one portion having a frustoconical shape (e.g., a frustoconical portion). In the process of forming the via structures 512-518, a laser drilling process may be employed to form the frustoconical portion. More particularly, the laser drilling process may be used to form an upper portion having a first frustoconical shape as shown in FIG. 5. Likewise, the laser drilling process may be used to form a lower portion having a second frustoconical shape.

Figure 6:
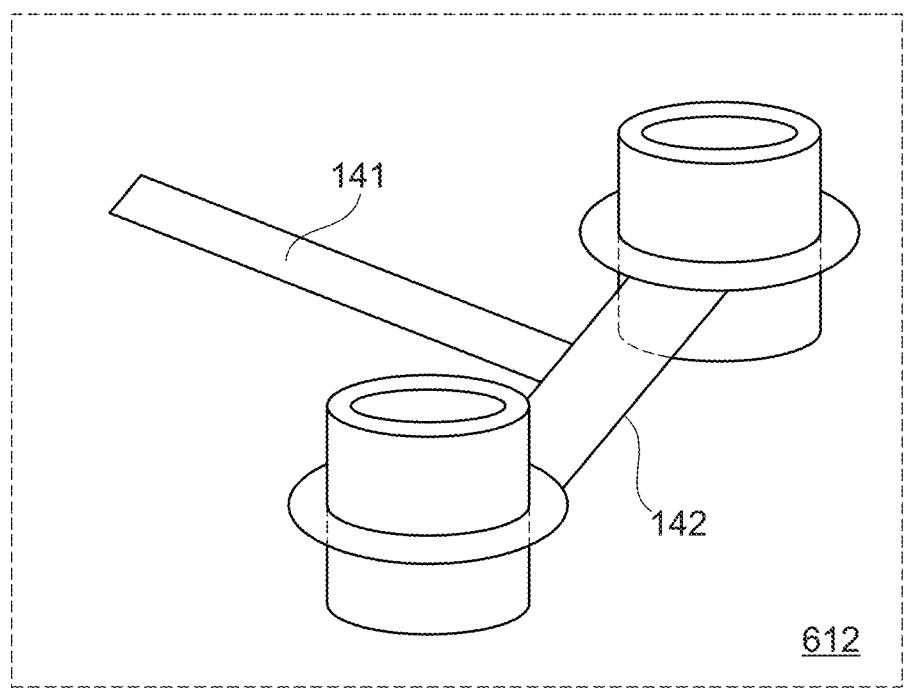
FIG. 6 illustrates a perspective view of a fourth implementation of the antenna structure shown in FIG. 1 in accordance with various embodiments of the present disclosure.

FIG. 6 illustrates a perspective view of a fourth implementation of the antenna structure shown in FIG. 1 in accordance with various embodiments of the present disclosure. The main body of the antenna structure shown in FIG. 1 can be implemented as a via structure 612 shown in FIG. 6. The via structure 612 is similar to the via structure 412 shown in FIG. 4 except that two holes form the via structure 612. The feedline structure 141 is connected to both holes through a conductive element 142. Alternatively, the antenna structure can be seen as having two main bodies as previously described, connected to the feedline structure 141 through a conductive element 142 connected to both main bodies, for instance through via capture pads respectively associated with one of the main bodies.

It should be noted that the via structure 612 described in FIG. 6 is merely an example and is not meant to limit the current embodiments. Any suitable via structure may be used. For example, the holes of the via structure 612 may be replaced by the holes shown in FIGS. 3 and 5.

Figure 7:
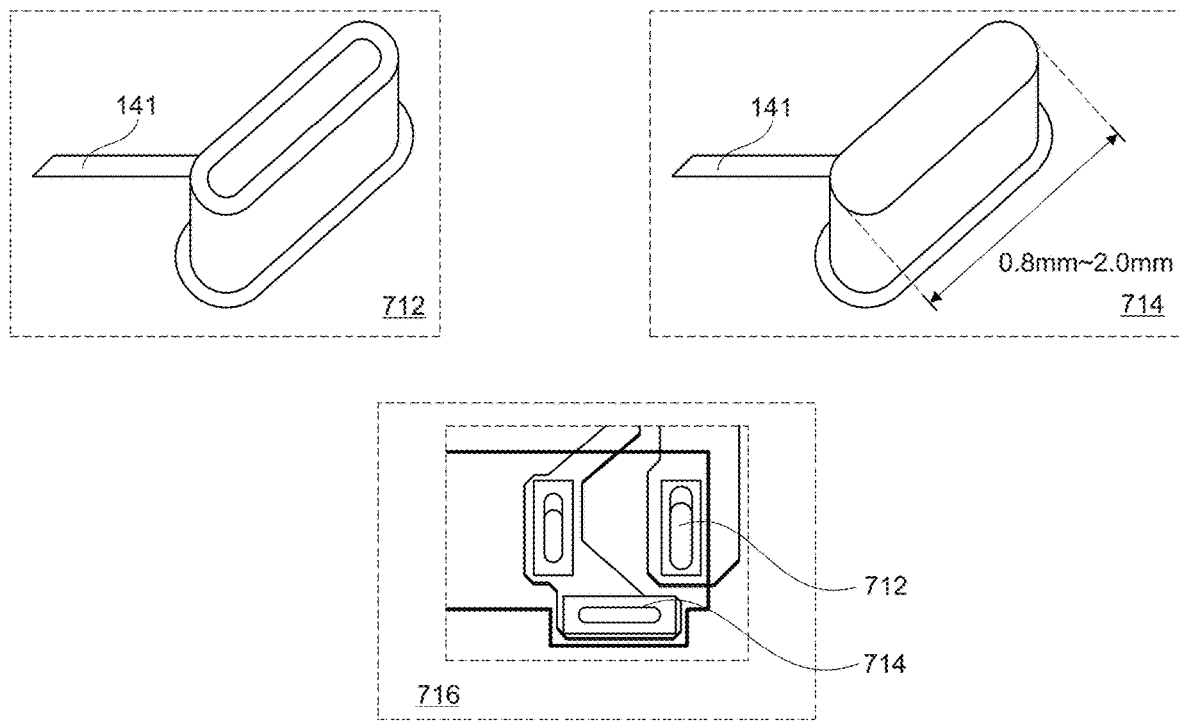
FIG. 7 illustrates a perspective view of a fifth implementation of the main body of the antenna structure shown in FIG. 1 in accordance with various embodiments of the present disclosure.

FIG. 7 illustrates a perspective view of a fifth implementation of the main body of the antenna structure shown in FIG. 1 in accordance with various embodiments of the present disclosure. The main body of the antenna structure shown in FIG. 1 can be implemented as a first via structure 712 and a second via structure 714 shown in FIG. 7. The first via structure 712 is a via slot connected to the feedline structure 141 as shown in FIG. 7. The via slot shown in FIG. 7 is a plated slot. In other words, the sidewall of the via slot is plated with a conductive material such as copper. The second via structure 714 is a bar-shaped via as shown in FIG. 7. The bar-shaped via may be formed by filling a via slot with a conductive material such as copper. As shown in FIG. 7, the length of the bar-shaped via is in a range from about 0.8 mm to about 2.0 mm. FIG. 7 further illustrates a top view 716 of the via slot (via structure 712) and the bar-shaped via (via structure 714).

Figure 8:
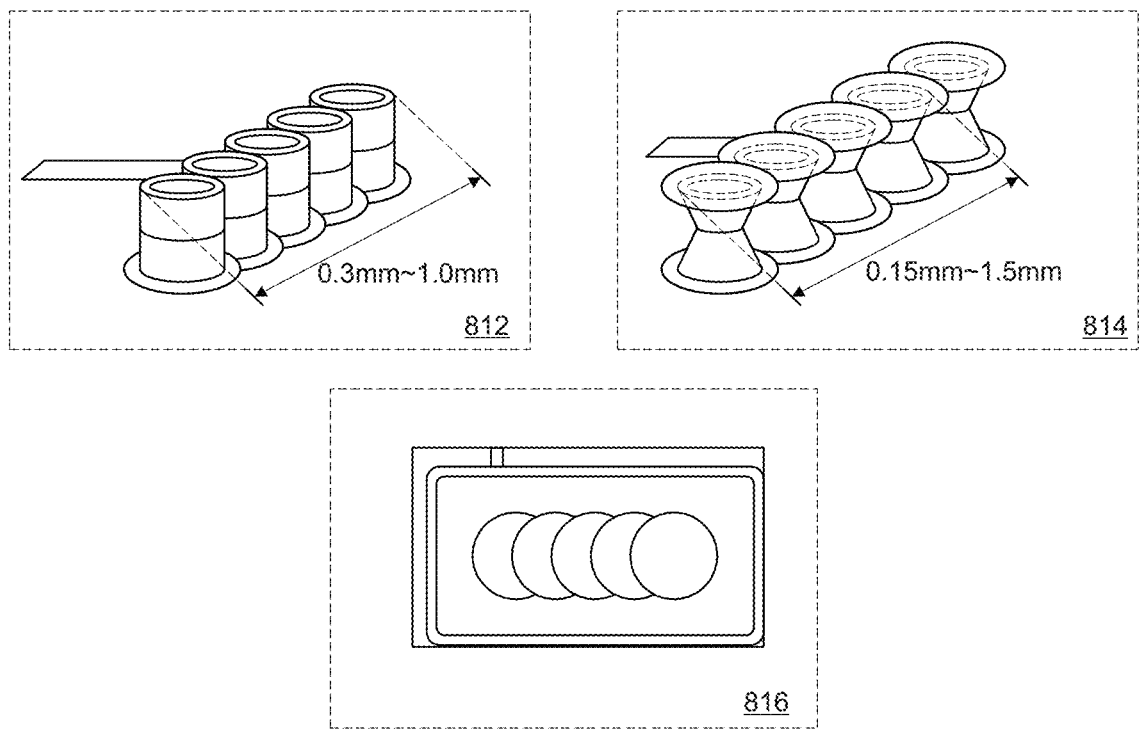
FIG. 8 illustrates a perspective view of a sixth implementation of the main body of the antenna structure shown in FIG. 1 in accordance with various embodiments of the present disclosure.

FIG. 8 illustrates a perspective view of a sixth implementation of the main body of the antenna structure shown in FIG. 1 in accordance with various embodiments of the present disclosure. The main body of the antenna structure shown in FIG. 1 can be implemented as a first via structure 812 and a second via structure 814 shown in FIG. 8. The first via structure 812 comprises a row of via holes connected to each other. Each via hole is plated with a conductive material such as copper. As shown in FIG. 8, the length of the row of via holes is in a range from about 0.3 mm to about 1.0 mm.

The second via structure 814 comprises another row of via holes connected to each other. Each via hole includes at least one portion having a frustoconical shape. As discussed above with respect to FIG. 5, the via hole of the second via structure 814 is formed by a laser drilling process. Furthermore, each via hole of the second via structure 814 is plated with a conductive material such as copper. As shown in FIG. 8, the length of the second via structure 814 is in a range from about 0.15 mm to about 0.5 mm. FIG. 8 further illustrates a top view 816 of the first via structure 812.

Figure 9:
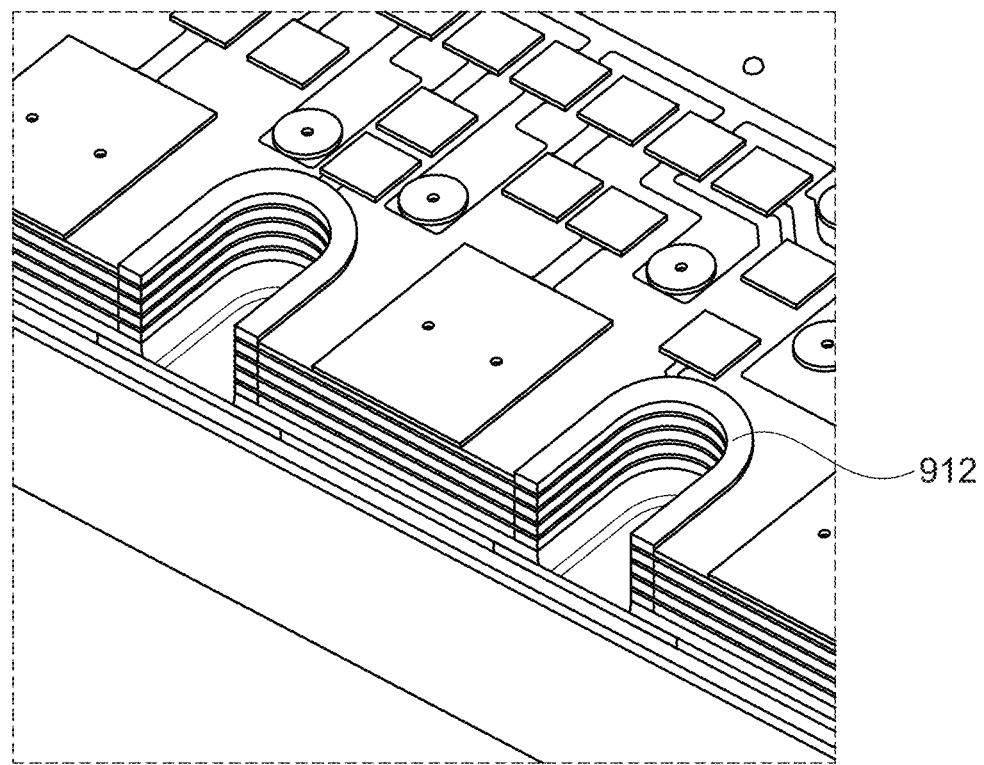
FIG. 9 illustrates a perspective view of a seventh implementation of the main body of the antenna structure shown in FIG. 1 in accordance with various embodiments of the present disclosure.

FIG. 9 illustrates a perspective view of a seventh implementation of the main body of the antenna structure shown in FIG. 1 in accordance with various embodiments of the present disclosure. The main body of the antenna structure shown in FIG. 1 can be implemented as a via at a package edge as shown in FIG. 9. As shown in FIG. 9, the via 912 is at an edge of the semiconductor package, and has a plated sidewall. The plated sidewall of the via 912 is exposed as shown in FIG. 9.

Figure 10:
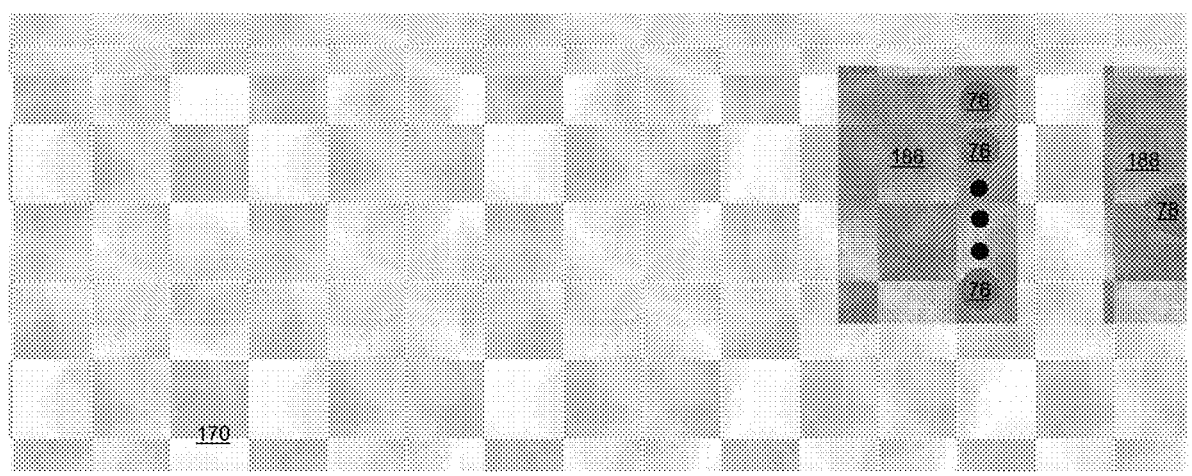
FIG. 10 illustrates a top view of the semiconductor device shown in FIG. 1 after the main body of the antenna structure has been implemented as a via at the edge of the semiconductor device in accordance with various embodiments of the present disclosure.

FIG. 10 illustrates a top view of the semiconductor device shown in FIG. 1 after the main body of the antenna structure has been implemented as a via at the edge of the semiconductor device in accordance with various embodiments of the present disclosure. The top view of FIG. 10 similar to that of FIG. 2 except that the main body of the antenna structure is implemented as a via at an edge of the semiconductor device. As shown in FIG. 10, the main body of the antenna structure is a half-circle via.

FIGS. 11-22 illustrate intermediate steps of fabricating the AiP device shown in FIG. 1 in accordance with various embodiments of the present disclosure. It should be noted that the fabrication steps as well as the structure of the AiP device shown in FIGS. 11-22 are merely an example. A person skilled in the art will recognize there may be many alternatives, variations and modifications.

Figure 11:
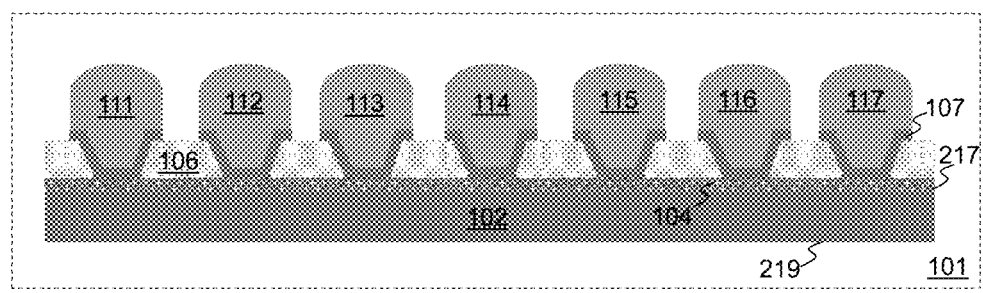
FIGS. 11-22 illustrate intermediate steps of fabricating the AiP device shown in FIG. 1 in accordance with various embodiments of the present disclosure.

FIG. 11 illustrates a cross sectional view of the semiconductor chip shown in FIG. 1 in accordance with various embodiments of the present disclosure. The semiconductor chip 101 comprises a substrate portion 102 and an interconnect portion formed over the substrate portion 102. The interconnect portion comprises a passivation layer 104, a buffer layer 106, a plurality of UBM structures 107 formed in the buffer layer 106, a plurality of bumps 111-117 over their respective UBM structures.

As shown in FIG. 11, the interconnect portion of the semiconductor chip 101 is over and in contact with a first side 217 of the substrate portion 102. The first side 217 of the substrate portion 102 is adjacent to the active circuits of the substrate portion 102. A second side 219 of the substrate portion 102 is opposite to the first side 217.

In some embodiments, the interconnect portion of the semiconductor chip 101 comprises the plurality of bumps 111-117. It should be noted while FIG. 11 illustrates seven bumps (e.g., bump 112) are in the interconnect portion, other suitable interconnect elements such as vias, metal lines, redistribution lines and the like may be formed in the interconnect portion depending on different design needs and applications.

The passivation layer 104 is formed over the substrate portion 102. The passivation layer 104 may be formed of a nitride such as silicon nitride or the like. Alternatively, the passivation layer 104 may be formed of an oxide such as silicon oxide or the like. The passivation layer 104 may be formed by a suitable fabrication process such as chemical vapor deposition (CVD) or the like.

The buffer layer 106 is formed over the passivation layer 104. The buffer layer 106 may be formed of a polymer such as PBO, polyimide, BCB or the like. The buffer layer 106 may be formed by any suitable fabrication processes such as spin coating, lamination, CVD or the like. In some embodiments, the buffer layer 106 is of a thickness in a range from about 5 micrometers to about 20 micrometers.

The bumps 111-117 are formed over the buffer layer 106. The bumps 111-117 may be formed by any suitable fabrication processes such as plating or the like. The bumps 111-117 may be electrically coupled to the RF circuit of the semiconductor chip 101.

It should be noted that the semiconductor chip 101 is drawn without details. The semiconductor chip 101 may comprise a substrate, active circuits (e.g., RFIC), a plurality of inter-layer dielectric (ILD) layers and inter-metal dielectric (IMD) layers.

The substrate of the semiconductor chip 101 may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The active circuits formed on the substrate may be any type of circuitry suitable for a particular application. In accordance with an embodiment, the active circuits may include various n-type metal-oxide semiconductor (NMOS) and/or p-type metal-oxide semiconductor (PMOS) devices such as transistors, capacitors, resistors, diodes, photo-diodes, fuses and/or the like. The active circuits may be interconnected to perform one or more functions. The functions may include radio frequency circuits, memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

Figure 12:
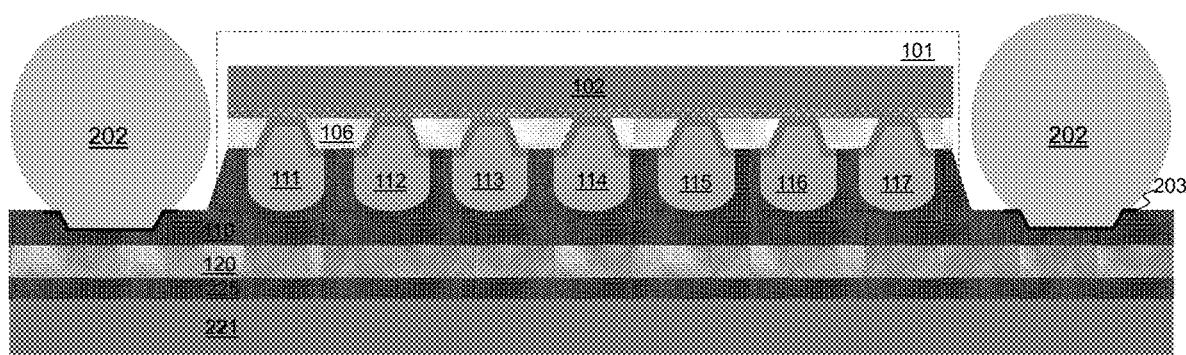

FIG. 12 illustrates a cross sectional view of the semiconductor device after the semiconductor chip has been mounted on a carrier in accordance with various embodiments of the present disclosure. The carrier 221 may be formed of silicon, glass, ceramic aluminum oxide, silicon oxide, any combinations thereof and/or the like. A release layer 225 is formed over the carrier 221. In some embodiments, the release layer 225 is formed of an epoxy-based thermal-release material. In alternative embodiments, the release layer 225 may be formed of an ultra-violet (UV) glue, which loses its adhesive property when exposed to UV lights. Furthermore, the release layer 225 may be formed of a light-to-heat conversion layer, which loses its adhesive property after the release layer has been exposed to laser light.

A first conductive layer 120 is formed over the carrier 221 as shown in FIG. 12. The first conductive layer 120 may be formed of any suitable conductive materials such as copper. The first conductive layer 120 may be made by any suitable method known in the art such as physical vapor deposition (PVD), sputter, CVD, electroplating and/or the like.

The semiconductor chip 101 is attached to the first conductive layer 120 using an underfill layer 110. As shown in FIG. 12, the front side of the semiconductor chip 101 is mounted over the carrier 221. The bumps 111-117 are embedded in the underfill layer 110.

It should be noted that while FIG. 12 illustrates a single semiconductor chip mounted on the carrier 221, the carrier 221 may accommodate any number of semiconductor chips.

As shown in FIG. 12, the underfill layer 110 may fill the gap between the front side of the semiconductor chip 101 and the first conductive layer 120. More particularly, the underfill layer 110 is disposed between the buffer layer 106 and the conductive layer (e.g., the first conductive layer 120). In some embodiments, the underfill layer 110 may be formed of an epoxy, which is dispensed at the gap between the front side of the semiconductor chip 101 and the first conductive layer 120. The epoxy may be applied in a liquid form, and may harden after a curing process. In alternative embodiments, the underfill layer 110 may be formed of curable materials such as polymer based materials, resin based materials, polyimide, epoxy and any combinations of thereof. The underfill layer 110 can be formed by any suitable dispense techniques.

A first input/output pad and a second input/output pad 202 are formed on the UBMs 203. The semiconductor chip 101 including the RF circuit is placed between the first input/output pad and a second input/output pad as shown in FIG. 12. Throughout the description, the first input/output pad and the second input/output pad 202 may be alternatively referred to as bumps.

In some embodiments, the input/output pads 202 may be solder balls as shown in FIG. 12. Alternatively, the input/output pads 202 may be implemented as other suitable input/output connectors such as metal pillars, controlled collapse chip connection (C4) bumps, micro bumps and the like. The input/output pads 202 may include a conductive material such as solder, copper, aluminum, gold, nickel, silver, palladium, tin, the like, or a combination thereof. In some embodiments, the input/output pads 202 are formed by initially forming a layer of solder through such commonly used methods such as evaporation, electroplating, printing or the like. Once a layer of solder has been formed, a reflow may be performed in order to shape the material into the desired bump shapes.

Figure 13:
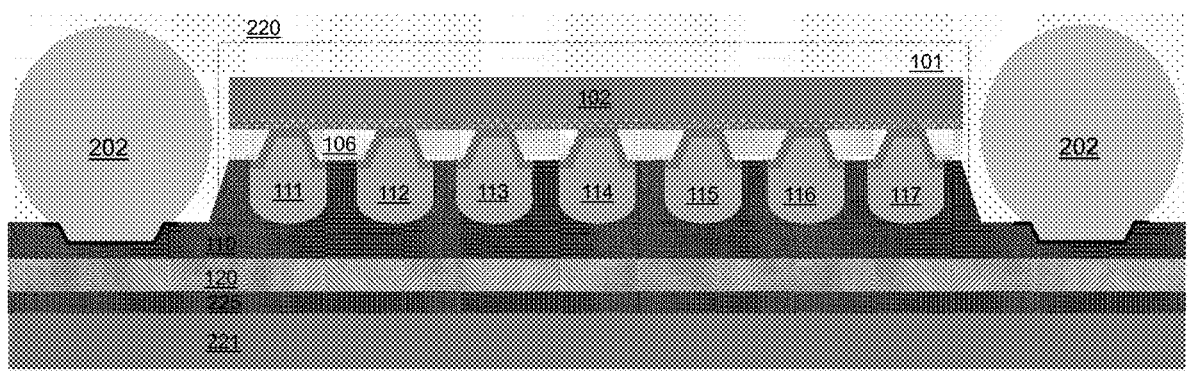

FIG. 13 illustrates a cross sectional view of the semiconductor device shown in FIG. 12 after forming a dielectric layer over the semiconductor device in accordance with various embodiments of the present disclosure. In some embodiments, the dielectric layer 220 is formed of suitable dielectric materials such as epoxy resin, glass fiber (e.g., pre-preg), mold compound materials and the like. In some embodiments, the dielectric layer 220 is a molding compound layer. The molding compound layer 220 may be formed of epoxy based resins and the like. Alternatively, the molding compound layer 220 may be replaced by photosensitive materials including polybenzoxazole (PBO), SU-8 photo-sensitive epoxy, film type polymer materials and/or the like. Throughout the description, the dielectric layer 220 may be alternatively referred to as a molding compound layer. In accordance with an embodiment, the molding compound layer 220 is either laminated or coated over the semiconductor device.

Figure 14:
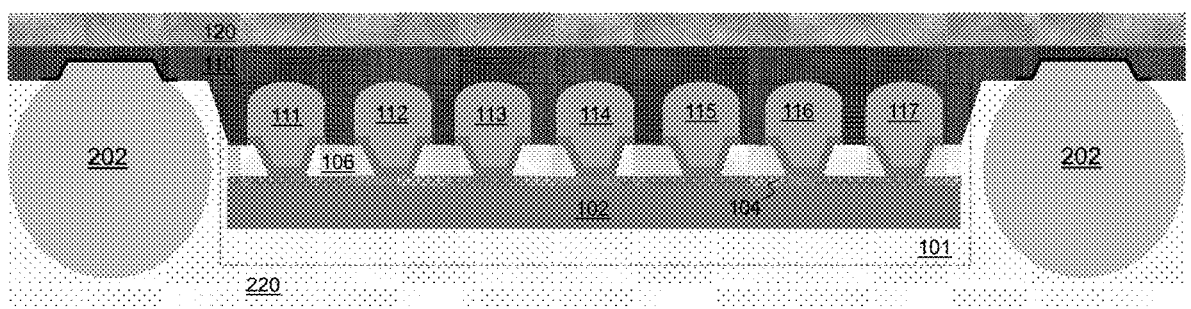

FIG. 14 illustrates a cross sectional view of the semiconductor device shown in FIG. 13 after the carrier has been removed in accordance with various embodiments of the present disclosure. The carrier 221 shown in FIG. 13 can be detached from the semiconductor device. A variety of detaching processes may be employed to separate the semiconductor device from the carrier 221. The variety of detaching processes may comprise a chemical solvent, a UV exposure, a laser de-bonding process and the like. The release layer 225 may be removed from the semiconductor device by using a suitable etching process such as a wet cleaning process.

Figure 15:
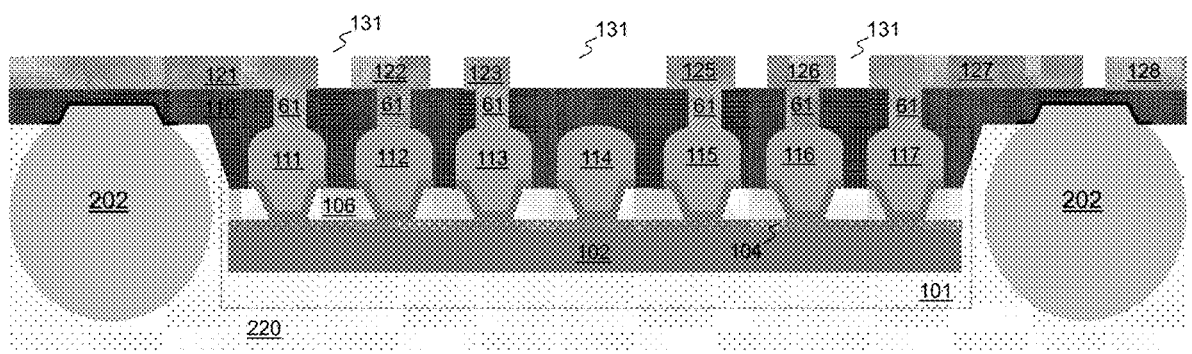

FIG. 15 illustrates a cross sectional view of the semiconductor device shown in FIG. 14 after a patterning process is applied to the first conductive layer in accordance with various embodiments of the present disclosure. The first conductive layer 120 (shown in FIG. 14) is patterned through suitable fabrication processes. Subsequently, vias 61 are formed in the underfill layer 110 and the first conductive layer 120. Furthermore, a plurality of openings 131 is formed in the first conductive layer 120. The openings 131 divide the first conductive layer 120 into a plurality of conductive elements 121-128 as shown in FIG. 15. The vias 61 may couple the conductive elements (e.g., conductive element 122) to the RFIC of the semiconductor chip 101 through the bumps (e.g., bump 112).

The patterning process of the first conductive layer 120 may be implemented by using suitable patterning techniques such as an etching process, a laser ablation/laser drilling process and/or the like.

Figure 16:
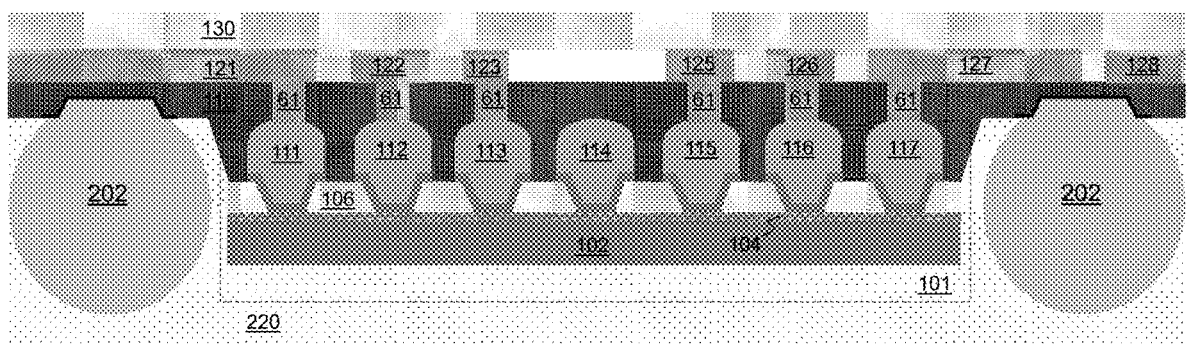

FIG. 16 illustrates a cross sectional view of the semiconductor device shown in FIG. 15 after a first laminate layer is formed over the first conductive layer in accordance with various embodiments of the present disclosure. The first laminate layer 130 may be formed of a low-loss high frequency material such as a woven glass reinforced hydrocarbon ceramic, polytetrafluoroethylene (PTFE) and the like. In alternative embodiments, the first laminate layer 130 may be commercial laminate material manufactured with copper cladding on one or both surfaces.

Figure 17:
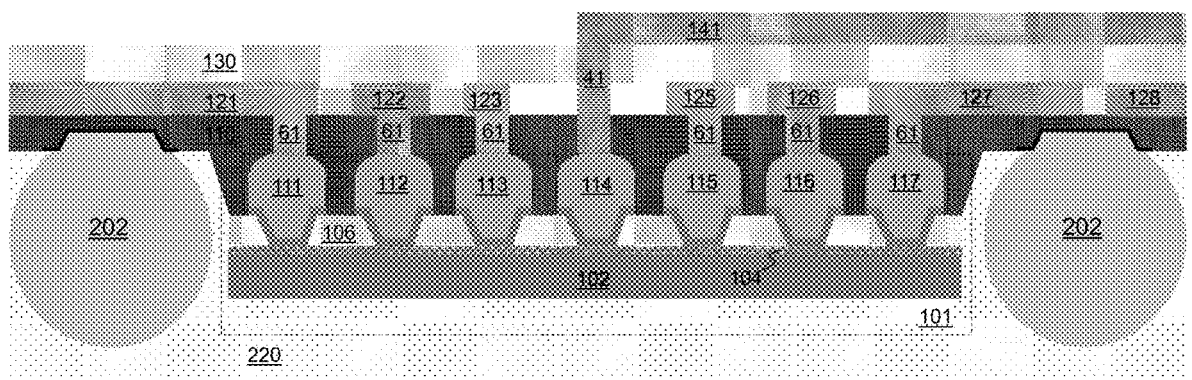

FIG. 17 illustrates a cross sectional view of the semiconductor device shown in FIG. 16 after a feedline structure is formed over the first laminate layer in accordance with various embodiments of the present disclosure. A conductive layer is formed over the first laminate layer 130. The conductive layer is patterned to form the feedline structure 141. Via 41 may be formed extending from the conductive layer through the first laminate layer 130 and the underfill layer 110. As shown in FIG. 17, the feedline structure 141 is electrically coupled to the RF circuit of the semiconductor chip 101 through the via 41. The via 41 extends through the opening of the first conductive layer. The opening in the first conductive layer may be used to prevent the via 41 from contacting the conductive elements (e.g., conductive elements 123 and 125) of the first conductive layer.

Figure 18:
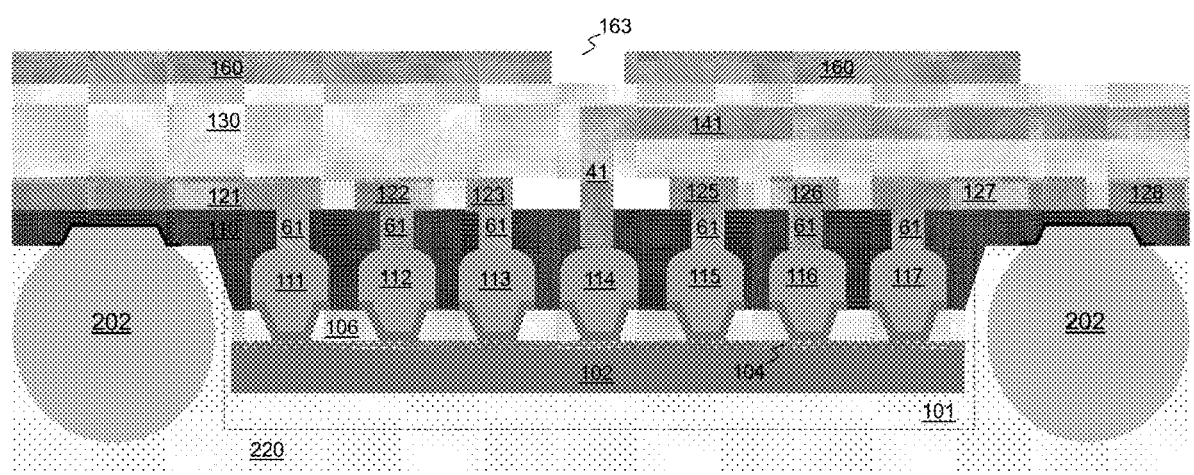

FIG. 18 illustrates a cross sectional view of the semiconductor device shown in FIG. 17 after forming a second laminate layer and a second conductive layer in accordance with various embodiments of the present disclosure. The second laminate layer and the second conductive layer 160 are formed over the feedline structure 141 using previously described processes for forming laminate layers and conductive layers. The dielectric material of the second laminate layer is similar to that of the first laminate layer 130. The second laminate layer and the first laminate layer are merged into a single laminate layer as shown in FIG. 18.

The second conductive layer 160 may be patterned to form an opening 163. In some embodiments, the second conductive layer 160 may be a ground layer which may facilitate the transfer of electromagnetic signals.

Figure 19:
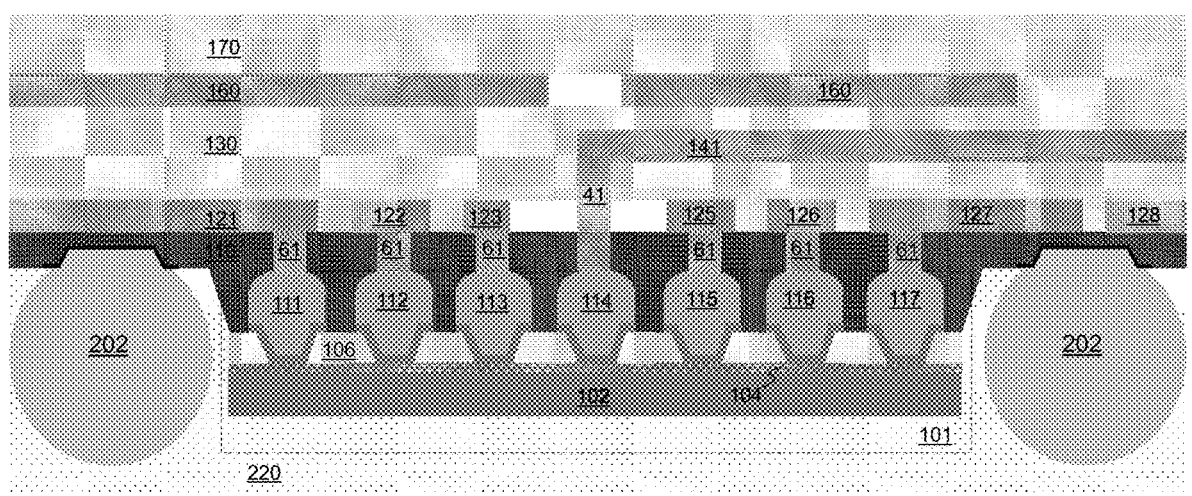

FIG. 19 illustrates a cross sectional view of the semiconductor device shown in FIG. 18 after forming a third laminate layer in accordance with various embodiments of the present disclosure. The third laminate layer 170 is formed over the second conductive layer 160 using previously described processes for forming laminate layers.

Figure 20:
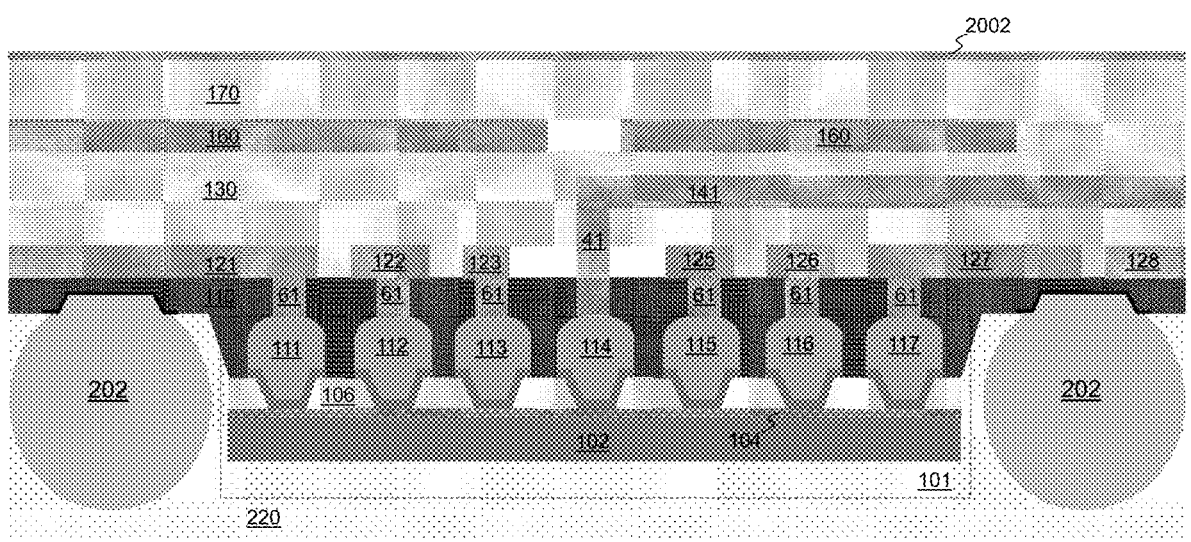

FIG. 20 illustrates a cross sectional view of the semiconductor device shown in FIG. 19 after a seed layer has been formed over the third laminate layer in accordance with various embodiments of the present disclosure. The seed layer 2002 is formed over the third laminate layer 170. The seed layer 2002 may comprise a suitable conductive material such as copper. In some embodiments, the seed layer 2002 may be formed using a suitable formation method such as CVD, PVD and the like.

Figure 21:
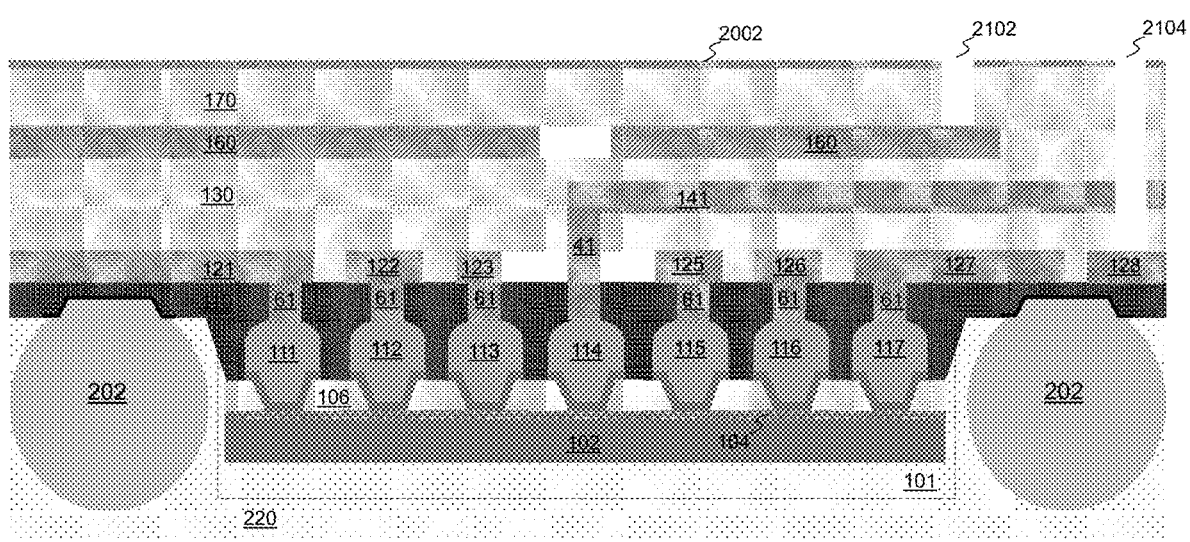

FIG. 21 illustrates a cross sectional view of the semiconductor device shown in FIG. 20 after two openings have been formed in the semiconductor device in accordance with various embodiments of the present disclosure. A first opening 2102 and a second opening 2104 are formed in the semiconductor device. As shown in FIG. 21, the first opening 2102 extends from the seed layer 2002 to a top surface of the second conductive layer 160. The second opening 2104 extends from the seed layer 2002 to a top surface of the conductive element 128. The openings 2102 and 2104 may be formed by a suitable semiconductor fabrication process such as an etching process, a laser drilling process and the like.

Figure 22:
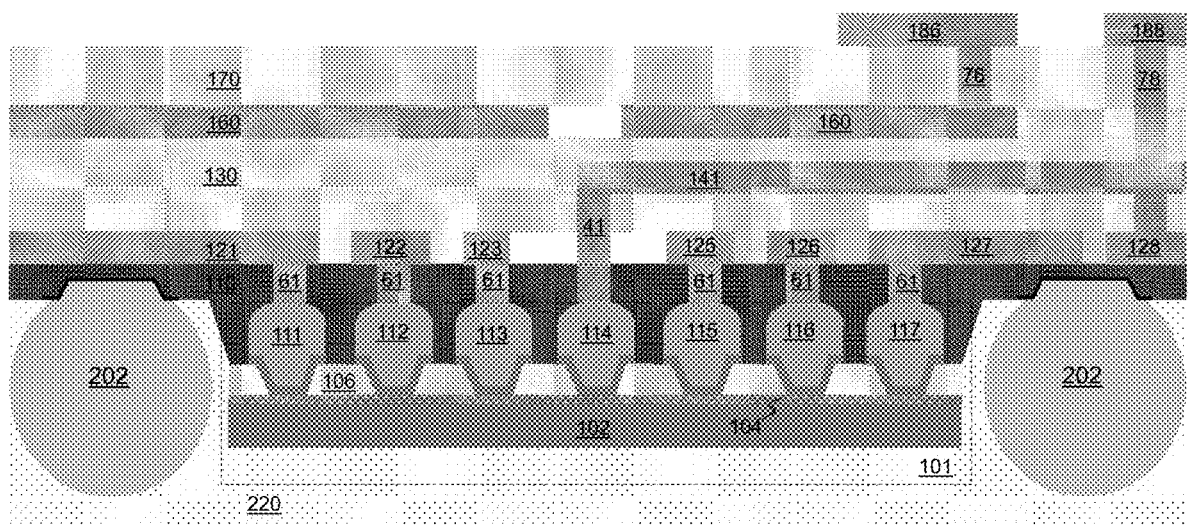

FIG. 22 illustrates a cross sectional view of the semiconductor device shown in FIG. 21 after a conductive material has been filled in the openings in accordance with various embodiments of the present disclosure. A conductive material (e.g., copper) has filled the openings 2102 and 2104 (shown in FIG. 21) to form the shielding vias 76 and the main body 78. Furthermore, the conductive material is used to form the shielding layer 186 and the extended portion 188 using a suitable formation method such as plating.

The formation process of the shielding layer 186 and the extended portion 188 comprises depositing a photoresist layer over the seed layer 2002 (shown in FIG. 20), plating the conductive material over exposed portions of the seed layer to form the shielding layer 186 and the extended portion 188, removing the photoresist layer to expose the seed layer under the photoresist layer, and after removing the photoresist layer, applying an etching process to remove exposed portions of the seed layer. The photoresist layer is of a predetermined pattern, which matches the shape of the shielding layer 186 and the extended portion 188.

It should be noted that the opening 2104 may be filled with the conductive material. Alternatively, the conductive material may be plated on the sidewall of the opening 2104.

It should further be noted that after forming the shielding layer 186 and the extended portion 188, the molding compound layer 220 may be removed from the semiconductor device by using a suitable etching process such as a wet cleaning process.

Figure 23:
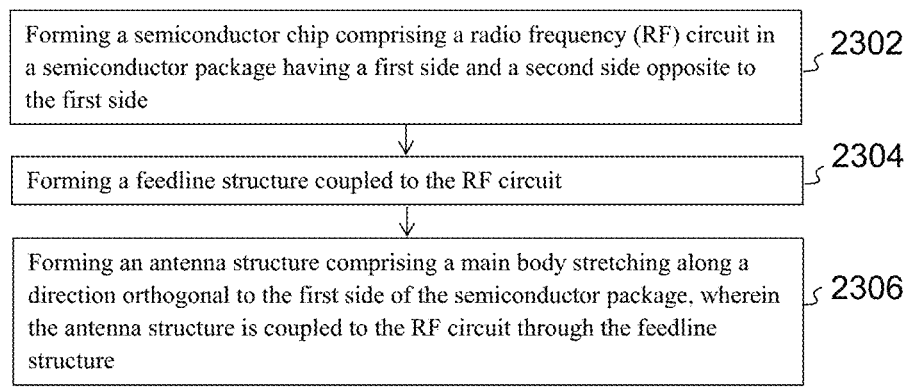
FIG. 23 illustrates a flow chart of a method for fabricating the AiP device shown in FIG. 1 in accordance with various embodiments of the present disclosure.

FIG. 23 illustrates a flow chart of a method for fabricating the AiP device shown in FIG. 1 in accordance with various embodiments of the present disclosure. This flowchart shown in FIG. 23 is merely an example, which should not unduly limit the scope of the claims. One of ordinary skill in the art would recognize many variations, alternatives, and modifications. For example, various steps illustrated in FIG. 23 may be added, removed, replaced, rearranged and repeated.

At step 2302, a semiconductor chip is formed and subsequently mounted on a front side of a semiconductor device. The semiconductor chip comprises a RF circuit, a buffer layer over the RF circuit, a plurality of bumps over the buffer layer.

At step 2304, a plurality of laminate layers and conductive layers are formed between the front side and a backside of the semiconductor device. A feedline structure is formed at one conductive layer. The feedline structure is coupled to the RF circuit through a via and a bump. The via extends through an opening in a bottommost conductive layer.

At step 2306, an antenna structure is formed. The antenna structure comprises a main body stretching along a direction orthogonal to at least one side of the front side and the backside of the semiconductor device. The antenna structure is coupled to the RF circuit through the feedline structure.

Embodiments of the present invention are summarized here. Other embodiments can also be understood from the entirety of the specification and the claims filed herein.

Example 1. A semiconductor device with a front side and a backside opposite to the front side, the semiconductor device comprising: a semiconductor chip comprising a radio frequency (RF) circuit, a feedline structure coupled to the RF circuit, and an antenna structure comprising a main body stretching along a direction orthogonal to at least one side of the front side and the backside of the semiconductor device, wherein the antenna structure is coupled to the RF circuit through the feedline structure.

Example 2. The semiconductor device of example 1, where the antenna structure comprises at least one via capture pad connected to the feedline structure.

Example 3. The semiconductor device of example 2, where the at least one via capture pad is located at one end of the main body of the antenna structure.

Example 4. The semiconductor device of example 2, where the at least one via capture pad is at a location between two ends of the main body of the antenna structure.

Example 5. The semiconductor device of one of examples 1 to 4, where the main body of the antenna structure comprises at least one portion formed by a plating arranged as a sidewall of a hole of the semiconductor device.

Example 6. The semiconductor device of one of examples 1 to 5, where the antenna structure further extends over the backside of the semiconductor device.

Example 7. The semiconductor device of one of examples 1 to 6, where the feedline structure comprises a single feedline coupling the antenna structure to the RF circuit.

Example 8. The semiconductor device of one of examples 1 to 6, where the feedline structure comprises at least two feedlines coupling the antenna structure to the RF circuit.

Example 9. A method including: forming a semiconductor chip comprising a radio frequency (RF) circuit in a semiconductor package having a first side and a second side opposite to the first side, forming a feedline structure coupled to the RF circuit, and forming an antenna structure comprising a main body stretching along a direction orthogonal to the first side of the semiconductor package, wherein the antenna structure is coupled to the RF circuit through the feedline structure.

Example 10. The method of example 9, further including: forming a hole in the semiconductor package, wherein the hole and the feedline structure are coupled together through a via capture pad.

Example 11. The method of example 10, further including: forming at least a portion of the main body of the antenna structure through plating a sidewall of the hole.

Example 12. The method of example 10, further including: filling the hole with a conductive material to form at least a portion of the main body of the antenna structure.

Example 13. The method of one of examples 9 to 12, further including: forming a frustoconical portion of the main body of the antenna structure through applying a laser drilling to the semiconductor package.

Example 14. The method of one of examples 9 to 13, further including: extending the antenna structure over the second side of the semiconductor package.

Example 15. The method of example 9, further including: forming a hole in the semiconductor package, at least partially filling the hole with a conductive material, and forming a conductive via cap covering at least one end of the hole.

Example 16. A semiconductor package with a first side and a second side opposite to the first side, the semiconductor package comprising: a semiconductor chip comprising a radio frequency (RF) circuit, a feedline disposed over the semiconductor chip, wherein the feedline is coupled to the RF circuit, and an antenna structure coupled to the feedline through a via capture pad, and wherein a main body of the antenna structure is in the semiconductor package and oriented along a direction orthogonal to the first side of the semiconductor package.

Example 17. The semiconductor package of example 16, where the antenna structure further extends over the second side of the semiconductor package.

Example 18. The semiconductor package of example 17, where a plurality of conductive layers and laminate layers disposed between the first side and the second side of the semiconductor package, wherein the conductive layers and the laminate layers are arranged in an alternating manner, an underfill layer disposed between the semiconductor chip and the plurality of conductive layers and laminate layers, and a plurality of input/output structures mounted on the first side of the semiconductor package, wherein the plurality of input/output structures is electrically coupled to the RF circuit through input/output bumps of the semiconductor chip.

Example 19. The semiconductor package of one of examples 16 to 18, where the main body of the antenna structure comprises at least a portion formed as a conductive surface arranged within a hole of the semiconductor package.

Example 20. The semiconductor package of one of examples 16 to 19, where the semiconductor chip comprises a substrate comprising the RF circuit, a passivation layer over the substrate, a buffer layer over the passivation layer, and a plurality of bumps over the buffer layer, wherein the plurality of bumps is electrically coupled to the RF circuit.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
attaching a semiconductor chip comprising a radio frequency (RF) circuit in a semiconductor package having a first side and a second side opposite to the first side;
forming a feedline structure coupled to the RF circuit; and
forming an antenna structure comprising a main body stretching along a direction orthogonal to the first side of the semiconductor package, wherein the antenna structure is coupled to the RF circuit through the feedline structure, the antenna structure further comprises: an extended portion stretching in a direction orthogonal to the direction of the main body, wherein a longitudinal side of the main body stretching along the direction orthogonal to the first side of the semiconductor package extends from the feedline structure to the first side of the semiconductor package, the extended portion extends to an edge of the second side of the semiconductor package, a longitudinal side of the extended portion is coplanar to an edge of the second side of the semiconductor package, and the longitudinal side of the extended portion is a longest dimension of the extended portion.

2. The method of claim 1, further comprising:
forming a hole in the semiconductor package, wherein the hole and the feedline structure are coupled together through a via capture pad.

3. The method of claim 2, further comprising:
forming at least a portion of the main body of the antenna structure through plating a sidewall of the hole.

4. The method of claim 2, further comprising:
filling the hole with a conductive material to form at least a portion of the main body of the antenna structure.

5. The method of claim 1, further comprising:
forming a frustoconical portion of the main body of the antenna structure through applying a laser drilling to the semiconductor package.

6. The method of claim 1, further comprising:
extending the antenna structure over the second side of the semiconductor package.

7. The method of claim 1, further comprising:
forming a hole in the semiconductor package;
at least partially filling the hole with a conductive material; and
forming a conductive via cap covering at least one end of the hole.

8. A method of forming a semiconductor package with a first side and a second side opposite to the first side, the method comprising:
forming a feedline disposed over a semiconductor chip comprising a radio frequency (RF) circuit, wherein the feedline is coupled to the RF circuit; and
forming an antenna structure coupled to the feedline through a via capture pad, wherein a main body of the antenna structure is in the semiconductor package and a longitudinal side of the main body is oriented along a direction orthogonal to the first side of the semiconductor package, the longitudinal side of the main body extends from the feedline to the second side of the semiconductor package, an extended portion of the antenna structure extends to an edge of the second side of the semiconductor package, a longitudinal side of the extended portion of the antenna structure is coplanar to the edge of the second side of the semiconductor package, and the longitudinal side of the extended portion of the antenna structure is a longest dimension of the extended portion.

9. The method of claim 8, further comprising:
forming a plurality of conductive layers and laminate layers disposed between the first side and the second side of the semiconductor package, wherein the conductive layers and the laminate layers are arranged in an alternating manner;
forming an underfill layer disposed between the semiconductor chip and the plurality of conductive layers and laminate layers; and
forming a plurality of input/output structures mounted on the first side of the semiconductor package, wherein the plurality of input/output structures is electrically coupled to the RF circuit through input/output bumps of the semiconductor chip.

10. The method of claim 8, wherein forming the antenna structure comprises forming at least a portion of the main body of the antenna structure as a conductive surface arranged within a hole of the semiconductor package.

11. The method of claim 8, further comprising:
forming a passivation layer over a substrate of the semiconductor chip comprising the RF circuit;
forming a buffer layer over the passivation layer; and
forming a plurality of bumps over the buffer layer, wherein the plurality of bumps is electrically coupled to the RF circuit.

12. The method of claim 9, further comprising:
forming a hole in the semiconductor package, wherein the hole and the feedline are coupled together through a via capture pad.

13. The method of claim 12, further comprising:
forming at least a portion of the main body of the antenna structure through plating a sidewall of the hole.

14. A method of operating a semiconductor device comprising a front side and a backside opposite to the front side; a semiconductor chip comprising a radio frequency (RF) circuit; a feedline structure coupled to the RF circuit; and an antenna structure comprising a main body having a longitudinal side stretching along a direction orthogonal to at least one side of the front side and the backside of the semiconductor device, and an extended portion stretching in a direction orthogonal to the direction of the main body, wherein the longitudinal side of the main body extends from the feedline structure to the at least one side of the front side and the backside of the semiconductor device, and the extended portion extends to an edge of the backside of the semiconductor device, and wherein a longitudinal side of the extended portion is coplanar to the edge of the backside of the semiconductor device, and wherein the longitudinal side of the extended portion is a longest dimension of the extended portion, and wherein the antenna structure is coupled to the RF circuit through the feedline structure, the method comprising:
transferring electromagnetic signals between the RF circuit and the antenna structure via the feedline structure.

15. The method of claim 14, wherein transferring the electromagnetic signals comprises using active circuitry disposed on the semiconductor chip.

16. The method of claim 14, wherein:
the antenna structure comprises at least one via capture pad connected to the feedline structure.

17. The method of claim 16, wherein:
the at least one via capture pad is located at one end of the main body of the antenna structure.

18. The method of claim 16, wherein:
the at least one via capture pad is at a location between two ends of the main body of the antenna structure.

19. The method of claim 14, wherein:
the main body of the antenna structure comprises at least one portion formed by a plating arranged as a sidewall of a hole of the semiconductor device.

20. The method of claim 14, wherein:
the feedline structure comprises a single feedline coupling the antenna structure to the RF circuit.

* * * * *